United States Patent [19]

Pai et al.

[11] Patent Number: 5,786,238
[45] Date of Patent: Jul. 28, 1998

[54] LAMINATED MULTILAYER SUBSTRATES

[75] Inventors: Deepak K. Pai, Burnsville; Ronald R. Denny, Brooklyn Center; Jeanne M. Chevalier, Savage; George F. Schwartz, III, Hopkins; Clark F. Webster, Northfield; Robert M. Lufkin, Bloomington; Terrance A. Krinke, Roseville, all of Minn.

[73] Assignee: Generyal Dynamics Information Systems, Inc., Falls Church, Va.

[21] Appl. No.: 799,128

[22] Filed: Feb. 13, 1997

[51] Int. Cl.[6] .................................................. H01L 21/44
[52] U.S. Cl. ................................................. 438/118; 438/614
[58] Field of Search ..................................... 438/118, 119, 438/108, 128, 612, 613, 614, 615, 616

[56] References Cited

U.S. PATENT DOCUMENTS

| | | | |
|---|---|---|---|
| 4,612,083 | 9/1986 | Yasumoto et al. | 438/118 |
| 4,813,129 | 3/1989 | Karnezos | 29/832 |
| 4,814,855 | 3/1989 | Hodgson et al. | 174/52.4 |
| 4,818,728 | 4/1989 | Rai et al. | 437/209 |
| 4,829,375 | 5/1989 | Alzmann et al. | 358/101 |
| 5,146,674 | 9/1992 | Frankeny et al. | 29/830 |
| 5,176,771 | 1/1993 | Bravo et al. | 156/85 |
| 5,196,371 | 3/1993 | Kulesza et al. | 438/118 |
| 5,213,511 | 5/1993 | Sobhani | 439/67 |
| 5,276,955 | 1/1994 | Noddin et al. | 29/593 |
| 5,355,283 | 10/1994 | Marrs et al. | 361/760 |
| 5,357,674 | 10/1994 | Lumbard | 29/843 |
| 5,378,869 | 1/1995 | Marrs et al. | 219/121.71 |
| 5,384,952 | 1/1995 | Matsui | 29/840 |
| 5,426,850 | 6/1995 | Fukutomi et al. | 299/848 |
| 5,459,634 | 10/1995 | Nelson et al. | 361/306.3 |
| 5,483,100 | 1/1996 | Marrs et al. | 257/700 |

*Primary Examiner*—Kevin Picardat
*Attorney, Agent, or Firm*—Kinney & Lange, P.A.

[57] ABSTRACT

A process of laminating a large-layer-count (LLC) substrates includes formation of first and second vias through respective substrates. A conductive path is formed through each of the respective vias, and posts are formed on the respective vias, electrically connected to the respective conductive path. A non-flowable adhesive layer having an aperture is provided between the LLC substrates so that the posts confront each other through the aperture. The LLC substrates are pressed together through the non-flowable adhesive layer to mechanically bond them together, and so that the posts abut each other. Simultaneously, the posts are electrically bonded to each other in the aperture.

10 Claims, 3 Drawing Sheets

5,786,238

1

LAMINATED MULTILAYER SUBSTRATES

BACKGROUND OF THE INVENTION

The present invention relates to a process of laminating multiple large-layer-count substrates with reliable mechanical and electrical connections.

Multilayer substrates potentially offer the advantages of more efficient use of space in a circuit board design, but require more complex connection capability and circuit modularity. Significant problems exist in aligning, laminating, drilling and plating multilayer substrates, particularly for large-layer-count (LLC) substrates and substrates with high aspect ratios.

LLC substrates require relatively large drills to form via holes for connection to another LLC substrate. Alignment of layers and wandering of the drill bit present serious obstacles to correct registration and connection of the two substrates. Substrates with high aspect ratios introduce additional complications, since it is difficult to plate a via hole to connect multiple substrates without disturbing adjacent circuit features.

Additionally, it is desirable for the LLC substrates to be formed as separate, finished LLC substrates that can be independently tested before attachment to another LLC substrate. The process of electrical interconnection between substrates should also be repairable without damaging the existing construction of each layer and without affecting the precise alignment of layers, to permit repair of open connection between the substrates in question. If the interconnection of substrates is not repairable, as is often the case in existing multilayer substrate processes, the failure of a single connection causes the entire multilayer package of substrates to be incurably defective.

Therefore, there is a need in the art for an improved, repairable process of interconnecting two or more independent substrates.

SUMMARY OF THE INVENTION

The present invention is a process of interconnecting large-layer-count (LLC) substrates. First and second LLC substrates are provided. First and second vias are formed to extend through the respective substrates. A conductive path is formed through the first and second vias. First and second posts are formed on the substrates over the respective vias, electrically connected to the respective conductive paths. A non-flowable adhesive layer having an aperture is provided between the first and second LLC substrates, so that the first and second posts confront each other through the aperture. The first and second substrates are pressed together through the non-flowable adhesive layer so that the non-flowable adhesive layer is adhesively bonded to the first and second LLC substrates, and the first and second posts abut each other. Simultaneously, the first and second posts are bonded to each other.

A further aspect of the invention is a multilayer package comprising a plurality of interconnected LLC substrates. A first LLC substrate has top and bottom surfaces having conductive pads. A first via extends through the first LLC substrate and has side walls plated with conductive material to contact the conductive pads on the top and bottom surfaces of the first LLC substrate. A first post is formed on the first pad on the top surface over the first via in the first LLC substrate. A second LLC substrate has top and bottom surfaces having conductive pads. A second via extends through the second LLC substrate and has side walls plated with conductive material to contact the conductive pads on the top and bottom surfaces of the second LLC substrate. A second post is formed on the second pads on the top surface over the second via in the second LLC substrate. The second post confronts and is connected to the first post. A non-flowable adhesive film having an aperture is bonded to the first LLC substrate and the second LLC substrate, so that the second post confronts and abuts the first post through the aperture.

DETAILED DESCRIPTION OF THE PREFERRED EMBODIMENTS

Figure 1A:
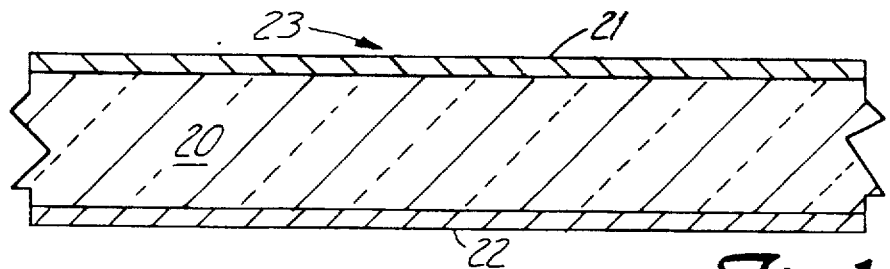
FIGS. 1A–1J are cross-sectional layer diagrams illustrating a process of laminating and interconnecting multiple substrates according to the present invention.
Figure 1B:
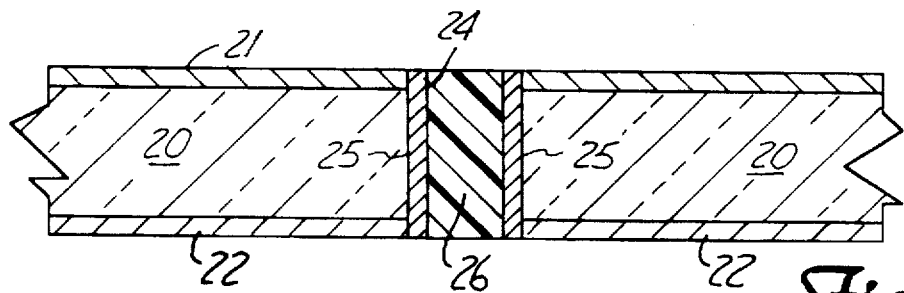
Figure 1C:
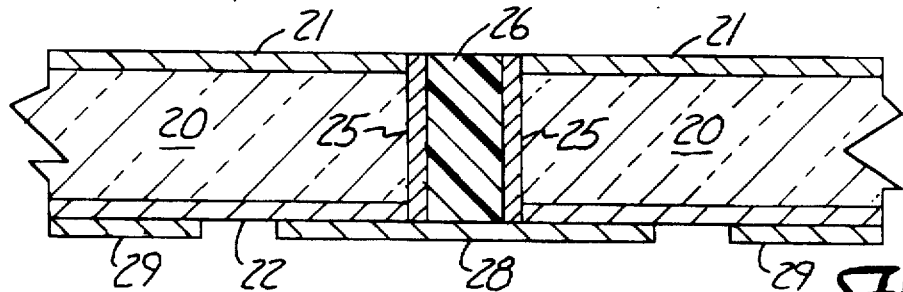
Figure 1D:
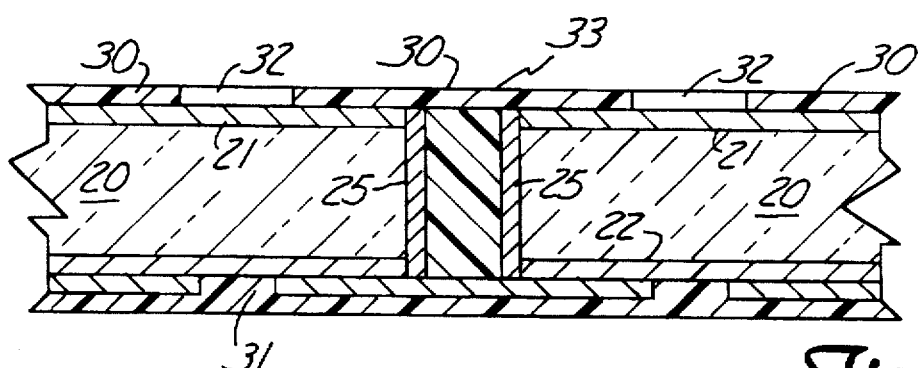
Figure 1E:
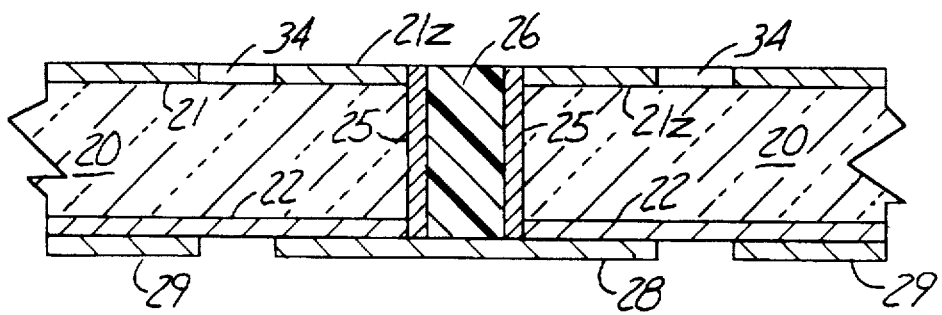
Figure 1F:
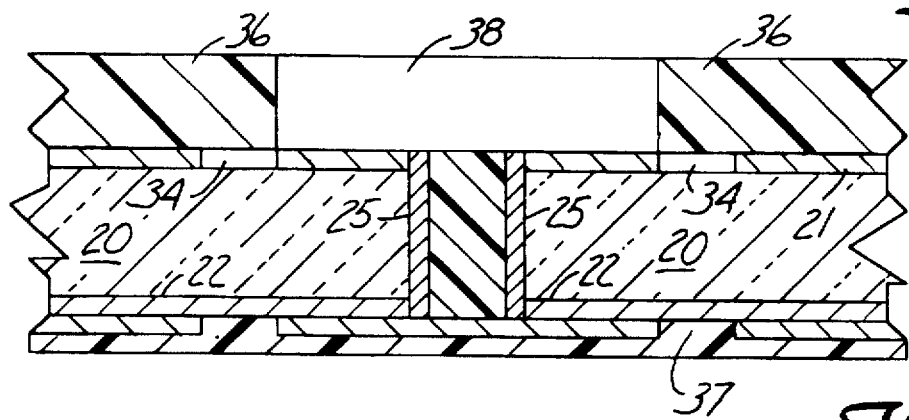

The present invention is directed to a process of laminating and interconnecting two or more large-layer-count (LLC) substrates 20. Although the process will be described as laminating and interconnecting two LLC substrates 20, it will be clear that the process is applicable to simultaneous lamination and interconnection of any reasonable number of LLC substrates. As shown in the drawings, an LLC substrate 20 is to be laminated to a second LLC substrate 20 (FIG. 1J). Each LLC substrate 20 is itself a multilayer board containing a plurality of conductive, insulating, and semi-conductive layers that have been patterned and interconnected to form part of an overall circuit. The fabrication of LLC substrates is well known in the art. Interconnection to other LLC substrates 20 occurs at dedicated regions 23 of the LLC substrate 20, which are isolated from the remaining circuitry of the LLC substrate 20.

Initially, substrate 20 is plated on a top side with copper layer 21 and on a bottom side with copper layer 22. Via 24 is drilled through copper layers 21 and 22 and the multiple layers forming substrate 20. Via 24 is plated with copper plating 25 using known through-hole plating techniques, and is filled with epoxy material 26. Nickel plated pad 28 is formed on bottom copper layer 22 and over epoxy-filled via 24. Conductive features 29 may be formed on bottom copper layer 22 by the same process as the formation of pad 28. Photoresist layers 30 and 31 are formed on the top and bottom surfaces, respectively, of the structure so that central region 33 of photoresist layer 30 covers the epoxy-filled and copper plated via hole 24 and is isolated from the remainder of photoresist layer 30 by a gap 32, which forms the bounds of central region 33. Gap 34 is etched into the exposed portions of top copper layer 21 through gap 32 in photoresist layer 30 to isolate a central portion of copper layer 21 to form pads 21z, where interconnection to other LLC substrates is to be made, from the remainder of copper layer 21. Photoresist layers 30 and 31 are then stripped away, yielding the configuration shown in FIG. 1E.

Photoresist layers 36 and 37 are formed over the top and bottom surfaces of the structure, respectively. Aperture 38 is patterned in top photoresist layer 36 to expose pads 21z and the top end of plated through-hole 24, filled with epoxy 26. Copper post 40 is formed in aperture 38 on the top surface of central copper layer portion 21z, and solder post 42 is formed on copper post 40. Photoresist layers 36 and 37 are then stripped away.

Figure 1G:
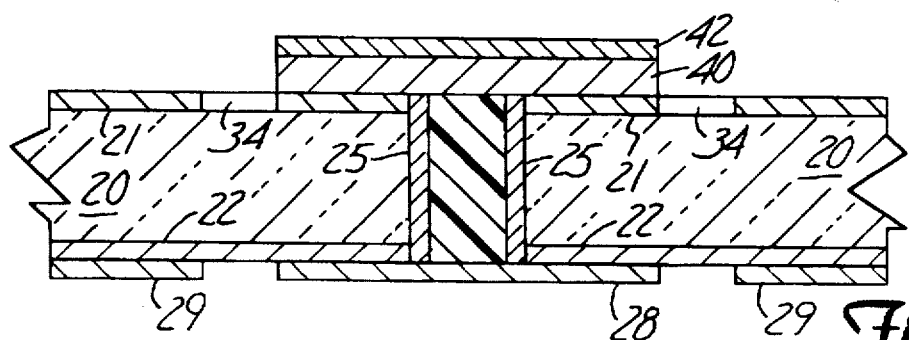
Figure 1H:
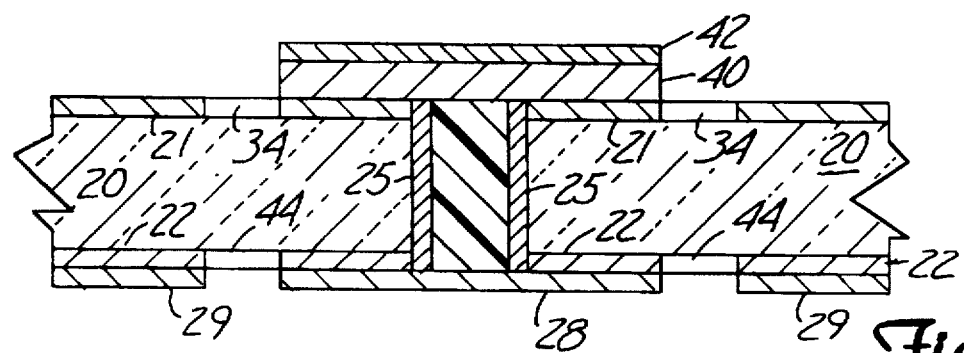

As shown in FIGS. 1G and 1H, a gap 44 is formed in bottom copper layer 22 to form the bounds of the central portion of bottom copper layer 22 to correspond to the bounds of the central nickel plated pad 28. Gap 44 may be etched into layer 22 through a photoresist layer patterned for that purpose, such as photoresist 31 or 37, or an additional photoresist layer deposited for that purpose. Moreover, gap 44 may be etched at any convenient time, such as when etching gap 32 in FIG. 1D. The resulting configuration is shown in FIG. 1H, at which point LLC substrate 20 is ready to be interconnected with another similarly configured LLC substrate.

Figure 1I:
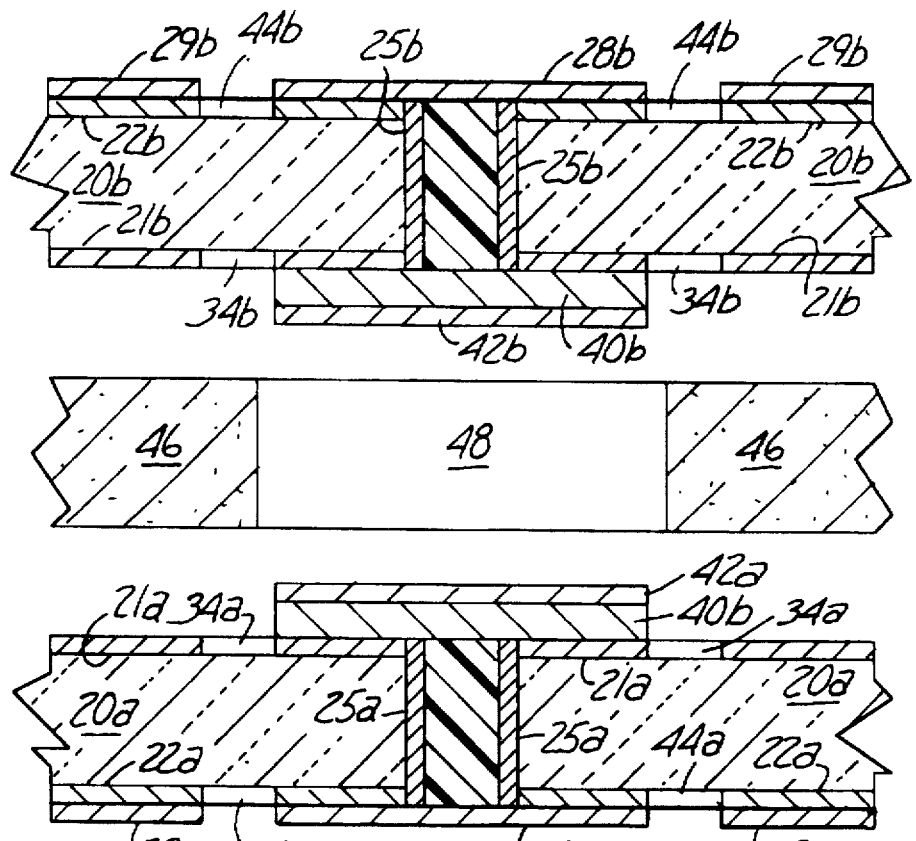
Figure 1J:
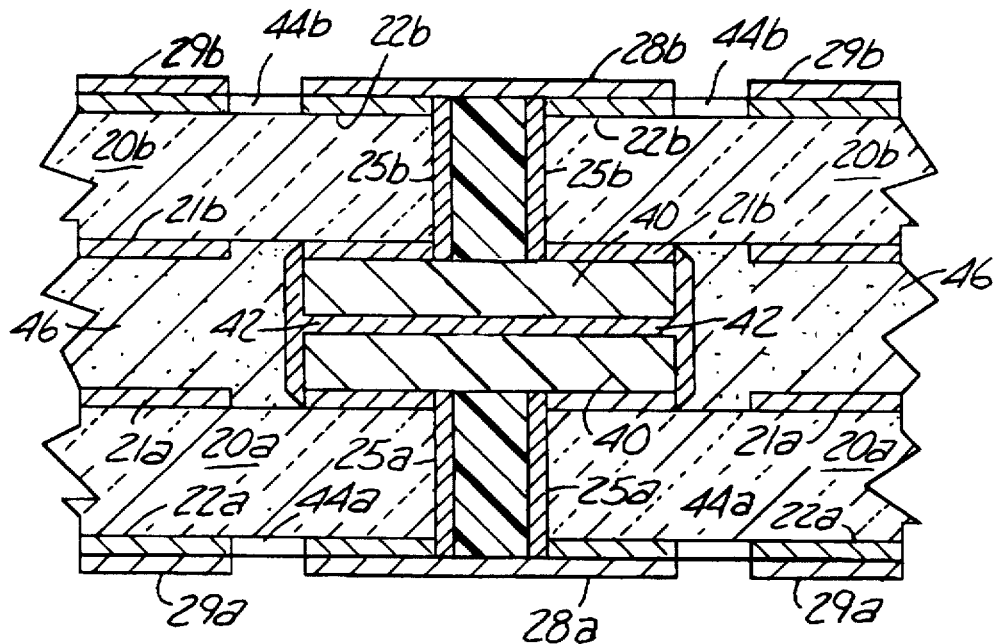

As shown in FIG. 1I, B-stage film adhesive 46 is positioned between two substrates 20a and 20b having copper and solder posts 40a, 42a and 40b, 42b confronting one another through a laser drilled aperture 48 in B-stage adhesive 46. The laser drilling of adhesive 46 cures the B-stage material along the perimeter of aperture 48, forming a cylindrical wall to contain flowable material (such as molten solder). The opposing substrates are then laminated together by simultaneously pressing substrates 20a and 20b together engaging solder posts 42a and 42b) and reflowing the solder. Molten solder is not able to flow into the via holes, since they are filled with epoxy material. The solder connection provides electrical coupling between the substrates, while the physical pressure of the substrates against B-stage adhesive 46 causes mechanical bonding between the substrates to occur through the adhesive film. As shown in FIG. 1J, parts of substrates 20a and 20b are actually embedded into B-stage adhesive 46. Thus, the substrates are laminated together with reliable electrical and mechanical connection therebetween.

Solder posts 42 are preferably realized on both substrates being interconnected, so that smaller posts can be used. This enables the cylindrical posts 42 to be more reliably and consistently formed and shaped. In an alternative embodiment, the solder in post 42 is replaced by a tin/silver combination that is bonded by diffusion of metal rather than by solder reflow. A trace of lead may be added to the tin/silver combination to lower its melting point.

Where more than two LLC substrates are to be laminated together, the middle substrates are formed with posts extending from both the top and bottom surfaces of the substrates, by a simple modification of the process shown. Any reasonable number of LLC substrates can be laminated and interconnected in this manner.

The preferred lamination procedure comprises applying pressure to force LLC substrates 20a and 20b together through B-stage adhesive 46. The preferred pressure is approximately 370-380 pounds per square inch (psi), but any amount of pressure that effectively produces reliable electrical and mechanical bonding between the LLC substrates may be used. The lamination temperature while the substrates are under pressure is preferably about 360° F. for about 15 minutes, ramped up to 383° F. in 5 minutes and held there for about 45 minutes. The pressure is then removed, and the temperature is held at about 375° F. for about 120 minutes. The lamination temperature may be adjusted for solders having different melting points. It is preferred that the solder is a low temperature solder (having a melting point of about 361° F.), so that reflow occurs without adversely affecting the multiple layers of each LLC substrate 20. When the tin/silver alloy is used to bond post 42 by diffusion, the lamination may be accomplished at a similar temperature, preferably about 390° F. A trace of lead may be added to the alloy, to lower its melting point so that lamination may be achieved at a slightly lower temperature.

The present invention provides the ability to repair open connections between substrates by reflowing the electrical joint formed by post 42 from the outside. The connection in question is raised to a temperature slightly greater than the melting point of the solder used in post 42, reflowing the solder without affecting circuit components of the substrates, due to the relatively low melting point of the solder used in post 42. Mechanical connection between the substrates is not affected by the increase in temperature, since B-stage adhesive 46 is non-flowable and mechanically bonds the substrates together, thereby preserving the precise alignment of substrates in the multilayer package.

The use of a non-flowable adhesive imparts an additional aligning function to B-stage adhesive 46. Laser drilled holes 48 and B-stage adhesive 46 are positioned to register and align the opposing substrates. Since the adhesive is non-flowable, holes 48 can be formed at predetermined, controlled positions in adhesive 46. In addition, the walls of laser drilled holes 48 contain the flowable material of posts 42 to electrically connect the substrates, confining the spread of flowable material to the outer walls of holes 48.

The present invention therefore provides a process of forming a multilayer substrate from two or more independently fabricated and tested substrates. The process allows connection to be made with tight tolerances, and reliable electrical and mechanical connections are achieved. Open connections can be repaired by reflowing the electrical joints from the outside. The invention is particularly useful to bond LLC substrates and substrates with high aspect ratios.

Although the present invention has been described with reference to preferred embodiments, workers skilled in the art will recognize that changes may be made in form and detail without departing from the spirit and scope of the invention.

What is claimed is:

1. A process of interconnecting large-layer-count (LLC) substrates, comprising:

providing first and second LLC substrates, each having a top surface and a bottom surface;

forming a first via in the first LLC substrate and a second via in the second LLC substrate, the first and second vias extending through the respective first and second LLC substrates between the respective top and bottom surfaces;

forming a conductive path through each of the first and second vias between the respective top and bottom surfaces;

forming a first post on the top surface of the first LLC substrate over the first via and electrically connected to the conductive path formed through the first via, and a second post on the top surface of the second LLC substrate over the second via and electrically connected to the conductive path formed through the second via;

providing a non-flowable adhesive layer having an aperture;

positioning the non-flowable adhesive layer between the first and second LLC substrates so that the first and second posts confront each other through the aperture in the non-flowable film adhesive layer; and simultaneously:

pressing the first and second LLC substrates together through the non-flowable adhesive layer so that the non-flowable film adhesive layer is adhesively bonded to the first and second LLC substrates and the first and second posts abut each other; and bonding the posts to each other electrically.

2. The process of claim 1, wherein the non-flowable adhesive layer comprises B-stage material.

3. The process of claim 2, wherein the aperture in the non-flowable adhesive layer is laser drilled to cure the B-stage material along a perimeter of the aperture.

4. The process of claim 1, wherein the first and second posts each include a layer of solder.

5. The process of claim 4, wherein bonding the posts to each other electrically comprises heating the posts to reflow the layers of solder.

6. The process of claim 1, wherein the first and second posts each include a layer of a metal alloy.

7. The process of claim 6, wherein the step of bonding the posts to each other electrically comprises diffusing the layers of metal alloy.

8. The process of claim 1, including plating the top surface of the substrates with a layer of copper.

9. The process of claim 8, wherein the step of providing a conductive path through each of the first and second vias comprises plating side walls of the vias with copper to contact the copper layer plated on the top surface of the substrates.

10. The process of claim 9, further comprising filling the first and second vias with an epoxy material after plating the side walls of the vias.

* * * * *

UNITED STATES PATENT AND TRADEMARK OFFICE
CERTIFICATE OF CORRECTION

PATENT NO. : 5,786,238
DATED : July 28, 1998
INVENTOR(S) : Deepak K. Pai et al.

It is certified that error appears in the above-identified patent and that said Letters Patent is hereby corrected as shown below:

<u>Title page,</u>
[73] Assignee: The Assignee's first name is misspelled;
Please delete "Generyal", insert -- General --

Signed and Sealed this

Twenty-first Day of August, 2001

*Attest:*

NICHOLAS P. GODICI
*Attesting Officer*  *Acting Director of the United States Patent and Trademark Office*